(12) United States Patent
Qi et al.

(10) Patent No.: US 6,780,776 B1
(45) Date of Patent: Aug. 24, 2004

(54) NITRIDE OFFSET SPACER TO MINIMIZE SILICON RECESS BY USING POLY REOXIDATION LAYER AS ETCH STOP LAYER

(75) Inventors: Wen-Jie Qi, Austin, TX (US); John G. Pellerin, Austin, TX (US); William G. En, Milpitas, CA (US); Mark W. Michael, Cedar Park, TX (US); Darin A. Chan, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/023,328

(22) Filed: Dec. 20, 2001

(51) Int. Cl.$^7$ ............................................ H01L 21/302
(52) U.S. Cl. ...................... 438/706; 438/710; 438/712; 438/720; 438/745
(58) Field of Search ................................. 438/283, 287, 438/290, 301, 306, 706, 710, 712, 720

(56) References Cited

U.S. PATENT DOCUMENTS

| | | | |
|---|---|---|---|
| 5,670,404 A | | 9/1997 | Dai |
| 5,783,475 A | * | 7/1998 | Ramaswami ................ 438/303 |
| 5,899,719 A | * | 5/1999 | Hong ........................ 438/289 |
| 5,912,188 A | | 6/1999 | Gardner et al. |
| 6,063,698 A | * | 5/2000 | Tseng et al. ................ 438/585 |
| 6,165,831 A | | 12/2000 | Hsu |
| 6,187,645 B1 | | 2/2001 | Lin et al. |
| 6,294,432 B1 | | 9/2001 | Lin et al. |

FOREIGN PATENT DOCUMENTS

EP    0 345 875 A2n    12/1999

* cited by examiner

*Primary Examiner*—Nadine G. Norton
*Assistant Examiner*—Lan Vinh

(57) ABSTRACT

A method of forming a semiconductor device provides a gate electrode on a substrate and forms a polysilicon reoxidation layer over the substrate and the gate electrode. A nitride layer is deposited over the polysilicon reoxidation layer and anisotropically etched The etching stops on the polysilicon reoxidation layer, with nitride offset spacers being formed on the gate electrode. The use of the polysilicon reoxidation layer as an etch stop layer prevents the gouging of the silicon substrate underneath the nitride layer, while allowing the offset spacers to be formed.

15 Claims, 4 Drawing Sheets

NITRIDE OFFSET SPACER TO MINIMIZE SILICON RECESS BY USING POLY REOXIDATION LAYER AS ETCH STOP LAYER

FIELD OF THE INVENTION

The present invention relates to the field of semiconductor device manufacturing, and more particularly, to the use of offset spacers during the formation of a semiconductor device.

BACKGROUND OF THE INVENTION

As the minimum feature size in semiconductor integrated circuits shrinks, the distance between the source and the drain regions becomes smaller. The reduced spacing between the source and drain regions for the field-effect transistors (FETs) results in short channel effects such as punch-through, reduced source-to-drain breakdown voltage, reduced threshold voltage ($V_t$), and increased sub-threshold swing. To relieve the short channel effects, the semiconductor industry is constantly optimizing the fabrication processes for MOSFET devices. Current trends in VLSI fabrication of CMOS devices are toward reducing the junction depth of the source/drain regions because shallow junctions reduce encroachment of the source/drain depletion regions into the channel.

Advances in semiconductor processing technology have reduced channel lengths to well below 0.25 µm. At these sizes, any loss of effective channel length can be costly in terms of lowering the breakdown voltage of a transistor. Accordingly, limiting the lateral diffusion of the source/drain impurities is increasingly important.

A halo implant, also called a "pocket implant", can limit the lateral diffusion of the source and drain impurities. The halo implants impurities have a conductivity type opposite to that of the source and drain. Usually, the halo implant comes after defining the gate and before the source/drain diffusion. Due to the masking effect, the halo implant typically exhibits peak impurity concentration near the source/drain regions. To impede vertical diffusion of source/drain impurities, the implant energy for the halo implant should be carefully chosen so that the halo depth away from the peak is greater than the depth of the source/drain implant.

In order to reduce the overlap capacitance between the gate electrode and the drain, and thereby provide better AC performance for the transistor, it is desirable to separate the halo and the extension. Accordingly, offset spacers have been employed that are formed on the sides of a gate electrode. By forming a halo, followed by the formation of an offset spacer on the sidewalls of gate electrode, and then formation of the source drain extensions, the halo is physically located in front of the extension. Use offset spacers makes the effective channel length longer for a given physical channel length.

In the formation of offset spacers, a dielectric layer is typically deposited over the substrate and a gate electrode. An anisotropic etch is performed to clear the substrate on top of the gate electrode of the dielectric layer while leaving a portion of the dielectric layer on the gate sidewalls. This portion of the dielectric layer remaining on the gate sidewalls forms the offset spacer. Materials that have been described for use as the offset spacers includes silicon oxide and silicon nitride. Once the offset spacer is formed, a source/drain extension implant is performed using the offset spacer as a mask. Continued processing steps include the formation of sidewall spacers over the offset spacers followed by deep source/drain implants.

The formation of the offset spacers in the above-described manner creates a problem in that the anisotropic etching gouges the silicon substrate caused by overetching of the dielectric layer from which the offset spacers are formed. This situation is depicted schematically in FIGS. 1 and 2. In FIG. 1, a substrate 10 has a gate electrode 12 on its surface. A dielectric layer 14 covers the substrate 10 and the gate electrode 12. An anisotropic etching is performed that removes the dielectric material 14 from the substrate to form the offset spacer 16. However, a recess 18 is also formed by the gouging of the substrate 10 caused by the overetching, since it is difficult to stop on silicon in anisotropic etching processes. The formation of the recess 18, especially in the source/drain extension area is a concern This is because silicon gouging is equivalent to increasing junction depth, which is undesirable as shallow depth junctions are sought after in today's technologies. Also, the overlap capacitance is adversely affected by the gouging created during offset spacer creation.

There is a need for a method of forming a semiconductor device with offset spacers in a manner that prevents gouging of the silicon substrate during the etching of the dielectric layer that forms the offset spacers.

SUMMARY OF THE INVENTION

These and other needs are met by embodiments of the present invention which provide a method of forming a semiconductor device, comprising the steps of forming a gate electrode on substrate and forming a polysilicon reoxidation layer over the substrate and the gate electrode. A nitride layer is deposited over the polysilicon reoxidation layer. The nitride is anisotropically etched, with this etching stopping on the polysilicon reoxidation layer to form nitride offset spacers on the gate electrode. The use of the polysilicon reoxidation layer as an etch stop layer during the formation of the nitride offset spacers prevents the gouging of the silicon substrate in accordance with embodiments of the present invention. The very thin polysilicon reoxidation layer may be left on the substrate, and implantation may controllably and reliably be made through the remaining polysilicon reoxidation layer to form the source/drain extensions and source/drain regions. Alternatively, the polysilicon reoxidation layer may be removed by a wet etch, without creating the gouging normally associated with dry etching of a dielectric layer.

The earlier cited needs are also met by embodiments of the present invention which provide a method of performing a semiconductor device with halo implants, comprising the steps of forming a gate electrode on a substrate and forming an etch stop layer on the substrate. A nitride layer is formed on the substrate and on the gate electrode. The nitride layer is etched to form offset spacers on the gate electrode, with the etching stopping on the etch stop layer.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of offset spacers in the creation of semiconductor devices. In particular, the present invention solves, in part, the problems of gouging that arises during the etching of a dielectric layer to form the offset spacers on the sidewalls of gate electrodes. Tee present invention achieves this, in part, by providing an etch stop layer, such as a polysilicon reoxidation layer, on the substrate of the semiconductor device. A nitride layer is deposited over the polysilicon reoxidation layer. The anisotropic etching of the nitride layer is selected so that the etching stops on the polysilicon reoxidation layer, rather than continuing through and gouging the silicon substrate. Since the polysilicon reoxidation layer is very thin, the implantation process may be controllably and reliably performed through the polysilicon reoxidation layer to form source/drain extensions and source/drain regions. Alternatively, the polysilicon reoxidation layer may be safely removed by a wet etch process without fear of gouging a silicon substrate. The prevention of gouging allows the separation of the halo and the extension, and reduces the overlap capacitance to provide better AC performance of the transistor. Also, the present invention, by preventing silicon gouging, maintains the effectiveness of shallow depth formation.

Figure 1:
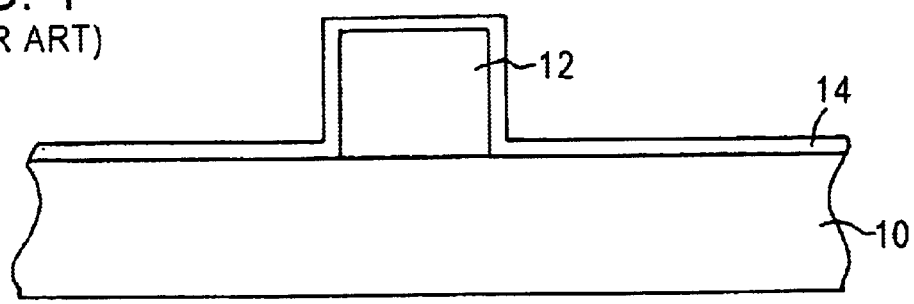
FIG. 1 is a schematic depiction of a cross-section of a semiconductor device during formation of the device in accordance with the prior art.
Figure 2:
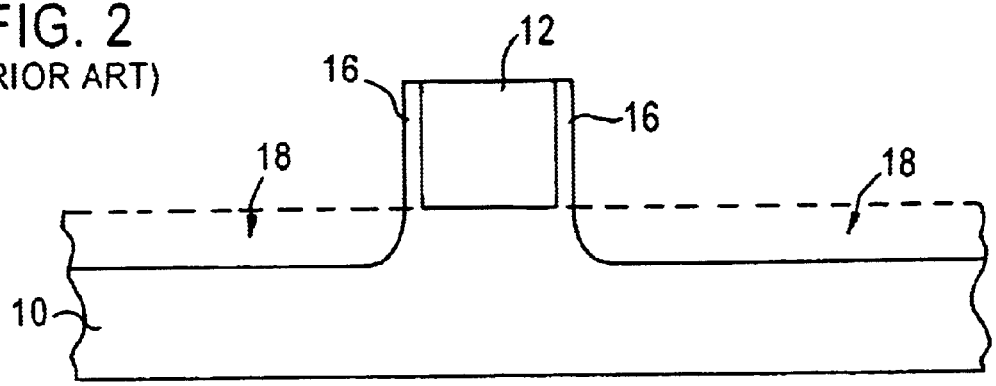
FIG. 2 shows the structure of FIG. 1 following dry etching of a dielectric layer with gouging of the substrate, in accordance with methods of the prior art.
Figure 3:
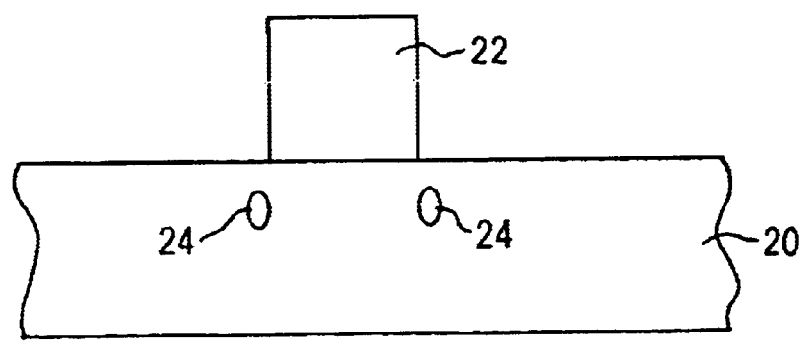
FIG. 3 shows a substrate and gate electrode during the formation of a semiconductor device in accordance with embodiments of the present invention.

FIG. 3 depicts a cross section of a semiconductor device during formation of the device and in accordance with embodiments of the present invention. This device includes a substrate 20 made from silicon, for example. On the top surface of the substrate 20, a gate electrode made of polysilicon, for example, is provided. Formation of the polysilicon gate electrode 22 may be conventional, and may include formation of a gate oxide followed by deposition of polysilicon or other gate electrode material, and etching to form the gate electrode 22.

Pictured in FIG. 3 are halo implants 24. The halo implants 24 are provided in a conventional halo implant process. Although halo implants 24 are depicted throughout the methodology of the present invention, it is to be un that the halo implants 24 are optional and embodiments of the present invention form semiconductor devices without such halo implants. These embodiments are not depicted in FIGS. 3–8, but one of ordinary skill in the art would understand that the methodology of the present invention may be performed with or without halo implants 24. However, for purposes of illustration and example, the halo implants 24 are shown in FIGS. 3–8.

Figure 4:
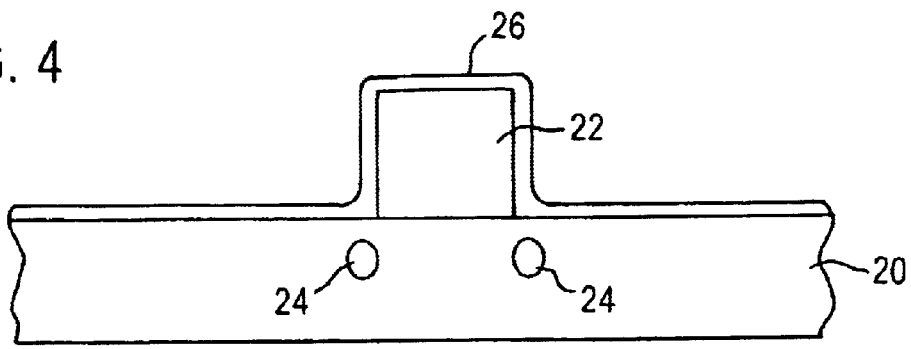
FIG. 4 depicts the structure of FIG. 3, following the formation of a polysilicon reoxidation layer over the substrate and the gate electrode, in accordance with embodiments of the present invention.

FIG. 4 depicts the structure of FIG. 3 following a polysilicon reoxidation step in accordance with embodiments of the method of the present invention. The polysilicon reoxidation step forms a polysilicon reoxidation layer 26 over the surface of the substrate 20 and the gate electrode 22. The polysilicon reoxidation layer 26 is formed by a conventional polysilicon reoxidation formation process, which provides a thermally grown oxidation layer at temperatures between about 750° C. to 900° C. The polysilicon reoxidation layer 26 is formed to a thickness of between 15 to about 50 Å, a preferred thickness being about 25 Å. The polysilicon reoxidation layer 26 is a very dense, high quality dielectric layer that will provide better selectivity as an etch stop layer in a subsequent etching step as described below.

Figure 5:
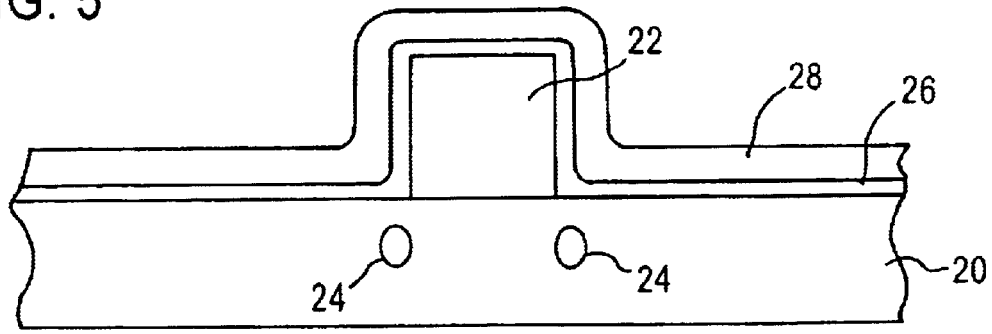
FIG. 5 chose the structure of FIG. 4, after a nitride layer has been deposited over the polysilicon reoxidation layer, in accordance with embodiments of the present invention.

In FIG. 5, a nitride layer 28 has been deposited conformally over the polysilicon reoxidation layer 26. The nitride layer 28, which may be made of silicon nitride, for example, can be deposited in a conventional manner by plasma enhanced chemical vapor deposition (PECVD) or low pressure chemical vapor deposition (LPCVD), as exemplary techniques. Nitride may be deposited at thicknesses of between about 100 to about 500 Å. An exemplary embodiment of the invention employs a thickness of about 250 Å of deposited nitride.

Figure 6:
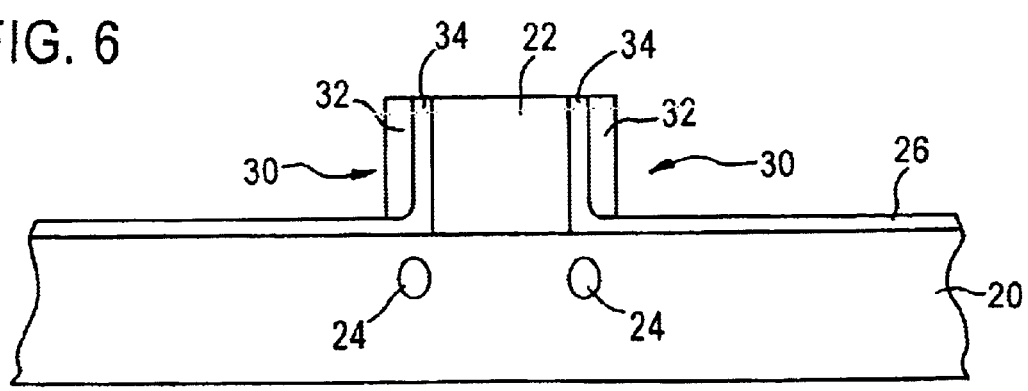
FIG. 6 depicts the structure of FIG. 5, after anisotropic etching has been performed to remove horizontal portions of the nitride layer, in accordance with embodiments of the present invention.

Following the deposition of the nitride layer 28, an anisotropic etch step is performed, the results of which are shown in FIG. 6. The anisotropic etch may be a reactive ion etch, using $CHF_3$, for example. The etching proceeds to remove the nitride layer 28 from horizontal surfaces, such as the top of the gate electrode 22 and the substrate 20. The polysilicon reoxidation layer 26 serves as an etch stop layer so that etching is stopped on the polysilicon reoxidation layer 26. This prevents the gouging of the silicon substrate 20 during the etching of the nitride layer 28. In prior art methodologies, the etching proceeds into the substrate and would form gouges and recesses, as described earlier, with undesirable consequences. The polysilicon reoxidation layer 26 provides an excellent selectivity as the nitride/oxide selectivity for an etchant is typically greater than an oxide/silicon selectivity or a nitride/silicon selectivity. Hence, the etching of the nitride layer 28 may be reliably stopped on the polysilicon reoxidation layer 26.

Figure 6A:
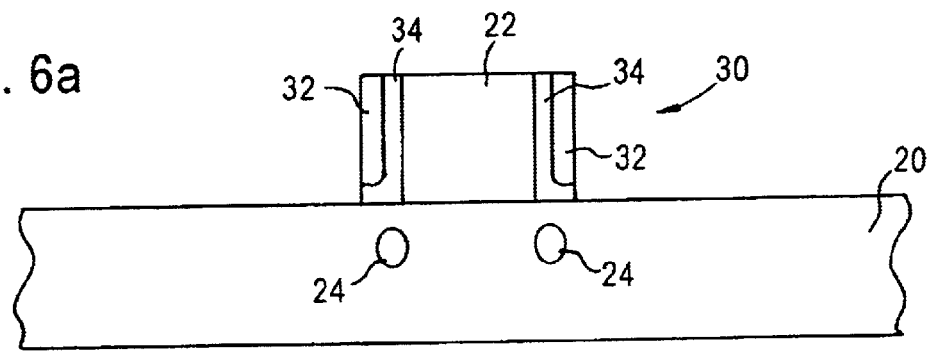
FIG. 6A shows an embodiment of the present invention in which a portion of the polysilicon reoxidation layer is removed by a wet etching process, in accordance with certain embodiments of the invention.

The offset spacers 30 are formed by a nitride portion 32 and a polysilicon reoxidation portion 34 on the sidewall of the gate electrode 22. As shown in FIG. 6A, portions of the polysilicon layer 26 that served as an etch stop layer during the anisotropic etching may be removed in certain embodiments by a wet etch process to expose the top surface of the substrate 20. An exemplary wet etch process that will remove the polysilicon reoxidation layer 26 without attacking significantly the silicon substrate 20 is a 100:1 HF solution. The removal of the polysilicon reoxidation layer 26 over the substrate 20 provides an unimpeded path for implantation of the source/drain extensions and the source/drain regions. However, in certain other embodiments of the invention, the polysilicon reoxidation layer 26 over the substrate 20 may be allowed to remain on the substrate 20.

This is because the thickness of the polysilicon reoxidation layer 26 on the substrate is so relatively thin that implantations through the polysilicon reoxidation layer 26 into the substrate 20 may be reliably and controllably made. The remainder of the description and the figures will assume the polysilicon reoxidation layer 26 has been allowed to remain on the substrate 20. However, it should be clearly understood that other embodiments of the present invention provide for removal of the polysilicon a reoxidation layer 26.

Figure 7:
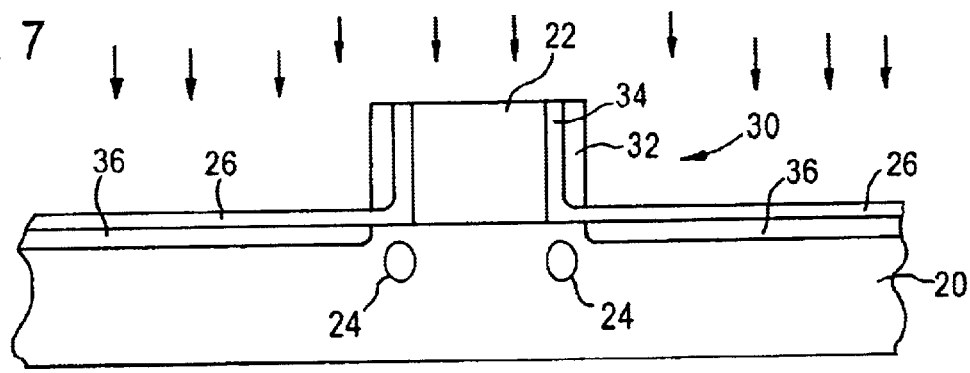
FIG. 7 depicts the structure of FIG. 6, after a source/drain extension has been implanted into the substrate, in accordance with embodiments of the present invention.

Following formation of the offset spacers 30, as depicted in FIG. 7, a source/drain extension implant is performed to create source/drain extensions 36. During this implantation, the offset spacers 30 act as a mask, as is conventionally understood.

Figure 8:
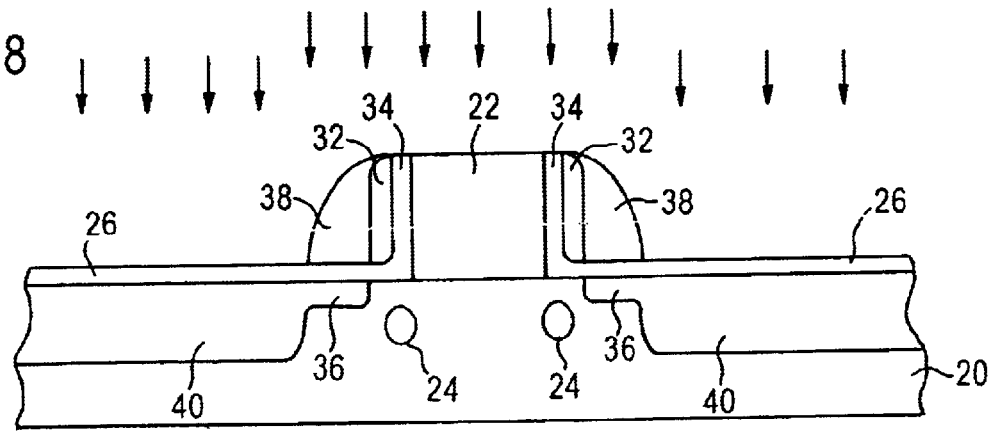
FIG. 8 shows the structure of FIG. 7, after a source/drain implant step has been performed, in accordance with embodiments of the present invention.

In FIG. 8, sidewall spacers 38 have been formed which act as masks over the source/drain extensions 36. A source/drain implant is then performed to create source/drain regions 40 in substrate 20. The implants are followed by an activation annealing step in accordance with conventional practices.

The present invention thus provides the benefit of offset spacers, but without the gouging exhibited in prior art semiconductor devices that used offset spacers. This is accomplished by the use of an etch top layer under the dielectric layer from which the offset spacers are etched in an anisotropic etch step.

Another aspect of the invention prevents boron penetration and prevents the undesirable silicidation of the entire polysilicon gate electrode, which can cause gate oxide reliability problems. Also, this aspect produces less polysilicon depletion.

Figure 9:
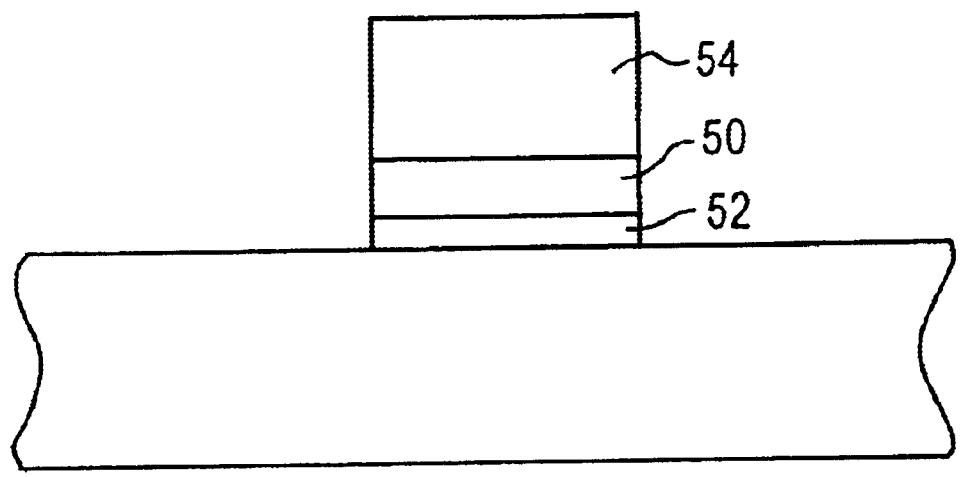
FIG. 9 depicts a gate electrode formed in accordance with an aspect of the invention.

As devices scale down, thin polysilicon is required. However, for thin polysilicon, the boron penetration problem becomes worse. Furthermore, the polysilicon may be too thin so that the entire polysilicon may be silicided, as mentioned above. This makes the poly/ate oxide interface rough and causes the gate oxide reliability problems. As depicted in FIG. 9, the invention forms a metal nitride barrier layer 50 over the gate oxide 52 and prior to the depositing of the polysilicon 54, to prevent boron penetration. Also, a later silicidation stops on this conductive metal nitride barrier layer 50. Other benefits of this process include little or no polysilicon depletion.

Although the present invention has been described and illustrated in detail, it is to be clearly understood that the same is by way of illustration and example only and it is not to be taken by way of limitation, the scope of the present invention being limited only by the terms of the appended claims.

What is claimed is:

1. A method of forming a semiconductor device, comprising the steps of:
   forming a gate electrode on a substrate;
   forming a polysilicon reoxidation layer over the substrate and the gate electrode;
   depositing a nitride layer over the polysilicon reoxidation layer;
   anisotropically etching the nitride layer and stopping on the polysilicon reoxidation layer to form nitride offset spacers on the gate electrode; and
   forming source/drain extensions in the substrate after the nitride layer has been etched, subsequently forming sidewall spacers on the offset spacers, and forming source/drains in the substrate.

2. The method of claim 1, further comprising forming halo implants in the substrate prior to depositing the nitride layer.

3. The method of claim 1, wherein the anisotropic etching is performed with a reactive ion etch process with a high nitride to oxide selectivity.

4. The method of claim 3, wherein the step of forming a polysilicon reoxidation layer comprises thermally growing oxide on the substrate and the gate electrode at temperatures between about 700° C. to about 900° C.

5. The method of claim 4, wherein the polysilicon reoxidation layer is between about 15Å to about 50Å thick.

6. The method of claim 5, wherein the step of anisotropically etching the nitride layer includes reactive ion etching with $CHF_3$ plasma etch gas.

7. The method of claim 6, further comprising removing the exposed polysilicon reoxidation layer after the nitride layer has been etched and prior to forming source/drain extensions in the substrate.

8. The method of claim 7, wherein the removing of the exposed polysilicon reoxidation layer includes wet etching the exposed polysilicon reoxidation layer.

9. The method of claim 8, wherein the exposed polysilicon reoxidation layer is wet etched with 100:1 HF solution.

10. A method of forming a semiconductor device with halo implants, comprising the steps of:
    forming a gate electrode on a substrate;
    forming an etch stop layer on the substrate;
    forming a nitride layer on the etch stop layer;
    etching the nitride layer to form offset spacers on the gate electrode, and stopping the etching on the etch stop layer;
    forming halo implants in the substrate; and;
    forming source/drain extensions and source/drain implants by implantation through the polysilicon reoxidation layer after the nitride layer has been etched.

11. The method of claim 10, wherein the step of etching the nitride layer includes reactive ion etching the nitride layer with a plasma etchant gas that has a high nitride to oxide selectivity.

12. The method of claim 10, wherein the etch stop layer is a polysilicon reoxidation layer.

13. The method of claim 10, further comprising removing portions of the polysilicon reoxidation layer exposed by the etching of the nitride layer to thereby expose the substrate.

14. The method of claim 13, wherein the step of removing portions of the polysilicon reoxidation layer includes wet etching.

15. The method of claim 14, wherein the step of etching the nitride layer includes reactive ion etching the nitride layer with a plasma etchant gas that has a high nitride to oxide selectivity.

* * * * *